United States Patent
Zhang et al.

(10) Patent No.: US 12,245,450 B2
(45) Date of Patent: Mar. 4, 2025

(54) ELECTRODE, METHOD OF MANUFACTURING THE SAME, LIGHT-EMITTING DEVICE AND DISPLAY DEVICE

(71) Applicant: BOE Technology Group Co., Ltd., Beijing (CN)

(72) Inventors: Can Zhang, Beijing (CN); Xiaochuan Chen, Beijing (CN); Can Wang, Beijing (CN); Han Yue, Beijing (CN); Ning Cong, Beijing (CN); Ming Yang, Beijing (CN); Minghua Xuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 20 days.

(21) Appl. No.: 18/089,154

(22) Filed: Dec. 27, 2022

(65) Prior Publication Data
US 2023/0133470 A1  May 4, 2023

Related U.S. Application Data

(62) Division of application No. 16/623,199, filed as application No. PCT/CN2019/098792 on Aug. 1, 2019, now abandoned.

(30) Foreign Application Priority Data

Aug. 1, 2018  (CN) .......................... 201810867144.5

(51) Int. Cl.
*H10K 50/818* (2023.01)
*H10K 50/816* (2023.01)
(Continued)

(52) U.S. Cl.
CPC ......... *H10K 50/818* (2023.02); *H10K 50/816* (2023.02); *H10K 50/852* (2023.02);
(Continued)

(58) Field of Classification Search
None
See application file for complete search history.

(56) References Cited

U.S. PATENT DOCUMENTS

| 10,431,774 B2 | 10/2019 | Lai et al. |
| 10,541,275 B2 | 1/2020 | Sakairi |

(Continued)

FOREIGN PATENT DOCUMENTS

| CN | 107211505 A | 9/2017 |
| CN | 107634084 A | 1/2018 |

(Continued)

OTHER PUBLICATIONS

First Office Action, including Search Report, for Chinese Patent Application No. 201810867144.5, dated Aug. 13, 2019, 20 pages.
(Continued)

*Primary Examiner* — Nilufa Rahim
(74) *Attorney, Agent, or Firm* — Westman, Champlin & Koehler, P.A.

(57) ABSTRACT

An electrode, a method of manufacturing the same, a light-emitting device, and a display device are provided, the electrode includes: a reflective layer; and two double-layer adjusting units stacked on the reflective layer, each including an insulating layer and a conductive layer sequentially arranged and directly contacted in a direction away from the reflective layer. For at least one unit, a via hole is provided in the insulating layer, an electrode lead formed integrally with the conductive layer is provided in the via hole, and electrically connected to the reflective layer through the electrode lead. In each unit, a difference between a thickness
(Continued)

of the conductive layer and a thickness of the insulating layer does not exceed a set threshold configured to control the thickness of the insulating layer. The conductive layer farthest from the reflective layer locates on different levels in light-emitting regions of different types of light-emitting devices.

21 Claims, 4 Drawing Sheets

(51) Int. Cl.
  *H10K 50/852* (2023.01)
  *H10K 50/856* (2023.01)
  *H10K 59/30* (2023.01)
  *H10K 71/00* (2023.01)
  *H10K 50/15* (2023.01)
  *H10K 50/16* (2023.01)
  *H10K 50/17* (2023.01)
  *H10K 50/19* (2023.01)

(52) U.S. Cl.
  CPC .......... *H10K 50/856* (2023.02); *H10K 59/30* (2023.02); *H10K 71/00* (2023.02); *H10K 71/621* (2023.02); *H10K 50/15* (2023.02); *H10K 50/16* (2023.02); *H10K 50/171* (2023.02); *H10K 50/19* (2023.02)

(56) References Cited

U.S. PATENT DOCUMENTS

| | | | |
|---|---|---|---|
| 2005/0218794 A1 | 10/2005 | Seo et al. | |
| 2011/0241000 A1* | 10/2011 | Choi | H10K 50/818 |
| | | | 257/59 |
| 2012/0001206 A1* | 1/2012 | Jeong | H10K 59/80517 |
| | | | 257/89 |
| 2015/0235943 A1 | 8/2015 | Suzumura et al. | |
| 2018/0006095 A1 | 1/2018 | Sakairi | |
| 2018/0108713 A1 | 4/2018 | Hatano | |
| 2018/0122875 A1 | 5/2018 | Bang et al. | |
| 2019/0165317 A1 | 5/2019 | Lai et al. | |
| 2019/0189701 A1 | 6/2019 | Bang et al. | |
| 2021/0111235 A1 | 4/2021 | Ichikawa et al. | |

FOREIGN PATENT DOCUMENTS

| | | | |
|---|---|---|---|
| CN | 107994059 A | 5/2018 | |
| CN | 108963108 A | 12/2018 | |
| KR | 20080003079 A | 1/2008 | |

OTHER PUBLICATIONS

USPTO-issued prosecution history for U.S. Appl. No. 16/623,199, including: Notice to the applicant regarding a non-compliant or non-responsive amendment, issued Oct. 28, 2022, 4 pages; Non-Final Rejection, issued Apr. 5, 2022, 12 pages; Final Rejection, issued Dec. 24, 2021, 8 pages; Requirement for Restriction/Election, issued Feb. 3, 2021, 9 pages; 45 total pages.

\* cited by examiner

ELECTRODE, METHOD OF MANUFACTURING THE SAME, LIGHT-EMITTING DEVICE AND DISPLAY DEVICE

CROSS-REFERENCE TO RELATED APPLICATION

This application divisional application of U.S. patent application Ser. No. 16/623,199, filed Dec. 16, 2019, which in turn is a Section 371 National Stage Application of International Application No. PCT/CN2019/098792, filed on Aug. 1, 2019, and claims the benefit of Chinese Patent Application No. 201810867144.5 filed on Aug. 1, 2018 in the National Intellectual Property Administration of China, the whole disclosures of which are incorporated herein by reference.

TECHNICAL FIELD

The present disclosure relates to the field of OLED display technologies, and in particular, to an electrode, a method of manufacturing the same, a light-emitting device, and a display device.

BACKGROUND

At present, in a display device for virtual reality display or augmented reality display, a micro organic electroluminescent display device is often used to display image. In order to make an image displayed by the micro organic electroluminescent display device closer to a real-world scene seen by naked eyes, it is necessary to ensure that the image displayed by the micro organic electroluminescent display device is not grainy after optical magnification. When a pixel density (i.e., Pixel Per Inch, abbreviated as PPI) of the micro organic electroluminescent display device is greater than 2000, the image displayed by the micro organic electroluminescent display device is less grainy after optical magnification, which may satisfy people's requirements for the quality of the image displayed by the micro organic electroluminescent display device.

SUMMARY

An aspect of the present disclosure provides an electrode, comprising: a reflective layer; and at least one double-layer adjusting unit stacked on the reflective layer, each double-layer adjusting unit comprising an insulating layer and a conductive layer sequentially arranged in a direction away from the reflective layer, wherein a via hole is provided in the insulating layer, an electrode lead formed integrally with the reflective layer is provided in the via hole, and the conductive layer is electrically connected to the reflective layer through the electrode lead.

According to some exemplary embodiments of the present disclosure, in each double-layer adjusting unit, a difference between a thickness of the conductive layer and a thickness of the insulating layer does not exceed a set threshold, and the set threshold is configured to control the thickness of the insulating layer.

According to some exemplary embodiments of the present disclosure, the set threshold is 250 Å.

According to some exemplary embodiments of the present disclosure, a thickness of the insulating layer is not greater than 650 Å.

According to some exemplary embodiments of the present disclosure, an optical path of light in the electrode is calculated by the following formula:

$$\Delta = (X_1 \times n_{11} + Y_1 \times n_{21}) + \ldots + (X_i \times n_{1i} + Y_i \times n_{2i}) + \ldots + (X_k \times n_{1k} Y_k \times n_{2k}),$$

wherein $\Delta$ is the optical path of the light in the electrode, $X_1$ is a thickness of the insulating layer included in a first double-layer adjusting unit of the at least one double-layer adjusting unit, $n_{11}$ is a refractive index of the insulating layer included in the first double-layer adjusting unit, $Y_1$ is a thickness of the conductive layer included in the first double-layer adjusting unit, $n_{21}$ is a refractive index of the conductive layer included in the first double-layer adjusting unit, $X_i$ is a thickness of the insulating layer included in an $i^{th}$ double-layer adjusting unit of the at least one double-layer adjusting unit, $n_{1i}$ is a refractive index of the insulating layer included in the $i^{th}$ double-layer adjusting unit, $Y_i$ is a thickness of the conductive layer included in the $i^{th}$ double-layer adjusting unit, $n_{2i}$ is a refractive index of the conductive layer included in the $i^{th}$ double-layer adjusting unit, i is an integer in the range of [1, k], k is the total number of the at least one double-layer adjusting unit, and k is an integer which is not less than 1.

According to some exemplary embodiments of the present disclosure, $X_1 = \ldots = X_i = \ldots = X_k$, and/or $Y_1 = \ldots = Y_i = \ldots = Y_k$, and/or $n_{1i} \ldots = n_{1k}$, and/or $n_{21} = \ldots = n_{2i} = \ldots = n_{2k}$.

According to some exemplary embodiments of the present disclosure, the insulating layer included in each double-layer adjusting unit is made of $SiN_x$ which has a refractive index of 1.5, and the conductive layer of each double-layer adjusting unit is made of indium tin oxide which has a refractive index of 1.8, wherein k=1, $X_1$=500 Å, $Y_1$=383 Å; or k=2, $X_1$=500 Å, $X_2$=200 Å, $Y_1$=442 Å, $Y_2$=233 Å; or k=2, $X_1$=$X_2$=500 Å, $Y_1$=$Y_2$=442 Å.

According to some exemplary embodiments of the present disclosure, the reflective layer comprises a shielding metal layer, and the conductive layer is a transparent conductive material layer.

Another aspect of the present disclosure provides a method of manufacturing the above electrode, comprising: forming the reflective layer; and forming the at least one double-layer adjusting unit on a surface of the reflective layer, wherein each of the double-layer adjusting units comprises the insulating layer and the conductive layer sequentially arranged in the direction away from the reflective layer, the insulating layer is provided with the via hole, the electrode lead is provided in the via hole, the conductive layer is electrically connected to the reflective layer through the electrode lead, and the electrode lead is formed integrally with the conductive layer.

According to some exemplary embodiments of the present disclosure, in each double-layer adjusting unit, a difference between a thickness of the conductive layer and a thickness of the insulating layer does not exceed a set threshold, the set threshold is configured to control the thickness of the insulating layer.

According to some exemplary embodiments of the present disclosure, forming the at least one double-layer adjusting unit on the surface of the reflective layer comprises: forming the insulating layer on the surface of the reflective layer; forming the via hole in the insulating layer; and forming a conductive material layer on a surface of the insulating layer away from the reflective layer, wherein a portion of the conductive material layer on the surface of the insulating layer away from the reflective layer forms the conductive layer, and a portion of the conductive material layer filling the via hole forms the electrode lead.

According to some exemplary embodiments of the present disclosure, forming the via hole in the insulating layer comprises: forming the via hole in the insulating layer by an etching process.

Another aspect of the present disclosure provides a light-emitting device comprising the first electrode according to the above embodiments.

According to some exemplary embodiments of the present disclosure, the light-emitting device further comprises a second electrode and an electroluminescent functional layer between the first electrode and the second electrode, wherein the second electrode is a transflective electrode.

According to some exemplary embodiments of the present disclosure, the electroluminescent functional layer comprises a first hole injection layer, a first hole transport layer, a red light-emitting layer, a green light-emitting layer, a first electron transport layer, a charge generation layer, a second hole injection layer, a second hole transport layer, a blue light-emitting layer, a second electron transport layer, and a first electron injection layer which are stacked sequentially.

According to some exemplary embodiments of the present disclosure, the first electrode is an anode, the second electrode is a cathode, a surface of the first electrode facing the second electrode is in contact with the first hole injection layer, and a surface of the second electrode facing the first electrode is in contact with the first electron injection layer.

According to some exemplary embodiments of the present disclosure, the first electrode is a cathode, the second electrode is an anode, a surface of the first electrode facing the second electrode is in contact with the first electron injection layer, and a surface of the second electrode facing the first electrode is in contact with the first hole injection layer.

Another aspect of the present disclosure provides a display device comprising at least one light-emitting device according to the above embodiments.

According to some exemplary embodiments of the present disclosure, the display device comprising at least three light-emitting devices, the at least three light-emitting devices comprising a first color light-emitting device, a second color light-emitting device, and a third color light-emitting device, wherein a thickness of the first electrode included in the first color light-emitting device, a thickness of the first electrode included in the second color light-emitting device and a thickness of the first electrode included in the third color light-emitting device are different from one another.

According to some exemplary embodiments of the present disclosure, the first color light-emitting device is a red light-emitting device, the second color light-emitting device is a green light-emitting device, and the third color light-emitting device is a blue light-emitting device, and the red light-emitting device, the green light-emitting device, and the blue light-emitting device are disposed in the same optical path period, and the thickness of the first electrode included in the red light-emitting device, the thickness of the first electrode included in the green light-emitting device, and the thickness of the first electrode included in the blue light-emitting device are sequentially decreased.

BRIEF DESCRIPTION OF THE DRAWINGS

The drawings described herein are used to provide a further understanding of the present disclosure and constitute a part of the present disclosure. The exemplary embodiments of the present disclosure and the description thereof are used to explain the present disclosure, and do not constitute an improper limitation on the present disclosure. In the drawings.

DETAILED DESCRIPTION OF THE EMBODIMENTS

Figure 1:
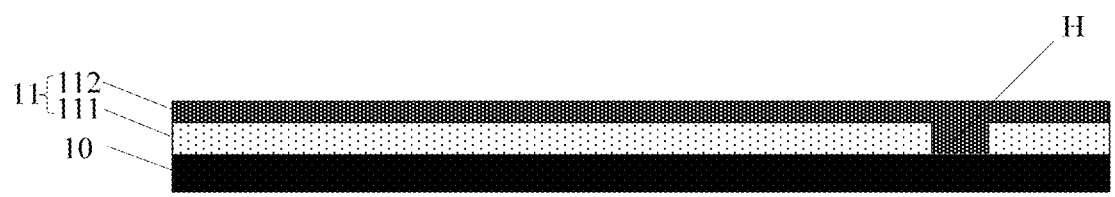
FIG. 1 is a schematic view of a basic structure of an electrode provided by some embodiments of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all of the embodiments. Based on the embodiments in the present disclosure, all other embodiments obtained by those skilled in the art without creative efforts should fall within the protection scope of the present disclosure.

The PPI of a micro organic electroluminescent display device manufactured by a full-color method using a combination of white organic electroluminescent display technology and color film technology (WOLED+CF) is greater than 2000. However, the color gamut and brightness of the micro organic electroluminescent display device manufactured by using WOLED+CF technology are not good as the color gamut and brightness of the micro organic electroluminescent display device manufactured by using a RGB side by side technology. When the micro organic electroluminescent display is manufactured by using the RGB side-by-side technology, a metal mask process is required to manufacture the micro organic electroluminescent display device, which results in a complicated manufacturing process of the micro organic electroluminescent display device.

Typically, in each of organic electroluminescent devices of different colors included in the micro organic electroluminescent display device, an anode, a cathode, and a structure therebetween constitute an optical microcavity, so that the brightness and color gamut of light emitted by the organic electroluminescent device is optically enhanced by the optical microcavity. The anode included in each organic electroluminescent device is generally composed of a reflective layer, a conductive layer, and an insulating layer located between the reflective layer and the conductive layer. A via hole is formed in the insulating layer, and the reflective layer is electrically connected to the conductive layer through the via hole. Generally, the insulating layers of the anodes included in the organic electroluminescent devices of different colors have difference thicknesses, so that the light emitted by each of the organic electroluminescent devices of different colors has a good monochromaticity.

The inventors of the present disclosure have found through research that, in the organic electroluminescent devices of different colors included in the micro organic electroluminescent display device, when the anode, the cathode, and the structure therebetween constitute the optical microcavity, since the insulating layer of the anode is relatively thick, it is impossible to form a via hole in the insulating layer through a conventional etching process. It is necessary to use expensive special trepanning equipment to form a via hole in the insulating layer, so that the cost of manufacturing the organic electroluminescent device is relatively high. In addition, a thickness of the conductive layer of the anode is relatively thin, and the insulating layer is relatively thick. In this case, when the conductive layer laps over the via hole to realize an electrical connection between the conductive layer and the reflective layer, an electrode lead formed by a portion of the conductive layer lapping over the via hole is prone to fracture. In this regard, in a conventional method, the via hole is first filled with a metal material, and then the conductive layer is formed on the surface of the insulating layer, so as to realize the electrical connection between the conductive layer and the reflective layer. However, the manufacture of the anode in this way is relatively complicated.

In view of this, some embodiments of the present disclosure provide an electrode, as shown in FIG. 1, the electrode includes a reflective layer 10 and at least one double-layer adjusting unit 11 stacked on the reflective layer 10. The double-layer adjusting unit 11 includes an insulating layer 111 and a conductive layer 112 which are sequentially arranged in a direction away from the reflective layer 10. The insulating layer 111 is provided with a via hole therein, and an electrode lead H formed integrally with the conductive layer 112 is provided in the via hole. In particular, in the double-layer adjusting unit, a difference between a thickness of the conductive layer 112 and a thickness of the insulating layer 111 does not exceed a set threshold, and the set threshold is configured to control the thickness of the insulating layer 111, so that the electrode lead H electrically connected to the reflective layer 10 is formed in the via hole while the conductive layer 112 is formed. By making the thickness difference between the insulating layer and the conductive layer not exceed the above-mentioned set threshold, the electrode lead H electrically connected to the reflective layer 10 may be formed in the via hole while the conductive layer 112 is formed without changing the thickness of the conductive layer. In other words, the above-mentioned set threshold value may indirectly control the thickness of the insulating layer 111.

Figure 2:
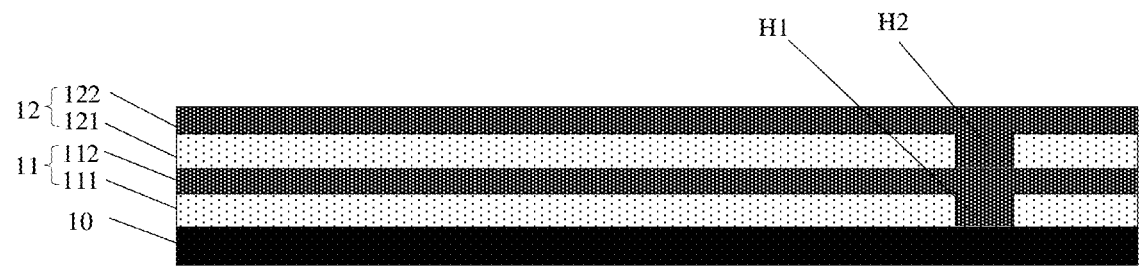
FIG. 2 is a schematic structural view of an electrode provided by some embodiments of the present disclosure.

In some exemplary embodiments, the electrode provided by the present disclosure includes two double-layer adjusting units stacked on the reflective layer 10, as shown in FIG. 2, which are a first double-layer adjusting unit 11 and a second double-layer adjustment unit 12, respectively. The first double-layer adjusting unit 11 includes a first insulating layer 111 and a first conductive layer 112, and the second double-layer adjusting unit 12 includes a second insulating layer 121 and a second conductive layer 122. A first electrode lead H1 which is formed integrally with the first conductive layer 112 is provided in a via hole in the first insulating layer 111, and a second electrode lead H2 which is formed integrally with the second conductive layer 122 is provided in a via hole in the second insulating layer 121. A difference between a thickness of the first conductive layer 112 and a thickness of the first insulating layer 111 does not exceed a set threshold, and the set threshold is configured to control the thickness of the first insulating layer 111 so that the first electrode lead H1 electrically connected to the reflective layer 10 is formed in the via hole while the first conductive layer 112 is formed. Similarly, a difference between a thickness of the second conductive layer 122 and a thickness of the second insulating layer 121 does not exceed the set threshold, and the set threshold is configured to control the thickness of the second insulating layer 121, so that the second electrode lead H2 electrically connected to the first conductive layer 112 is formed in the via hole while the second conductive layer 122 is formed.

In the embodiments shown in FIG. 2, the first double-layer adjusting unit 11 and the second double-layer adjusting unit 12 have the same configuration, and an orthographic projection of the first electrode lead H1 on the reflective layer 10 coincides with an orthographic projection of the second electrode lead H2 on the reflective layer 10.

Figure 3:
FIG. 3 is a schematic structural view of an electrode provided by some embodiments of the present disclosure.

Alternatively, in other embodiments, as shown in FIG. 3, the orthographic projection of the first electrode lead H1 on the reflective layer 10 is partially overlapped with the orthographic projection of the second electrode lead H2 on the reflective layer 10. In still other embodiments, the orthographic projection of the first electrode lead H1 on the reflective layer 10 may be not overlapped with the orthographic projection of the second electrode lead H2 on the reflective layer 10, as long as the second conductive layer 122 is electrically connected to the first conductive layer 112 through the second electrode lead H2, and the first conductive layer 112 is electrically connected to the reflective layer 10 through the first electrode lead H1.

Figure 4:
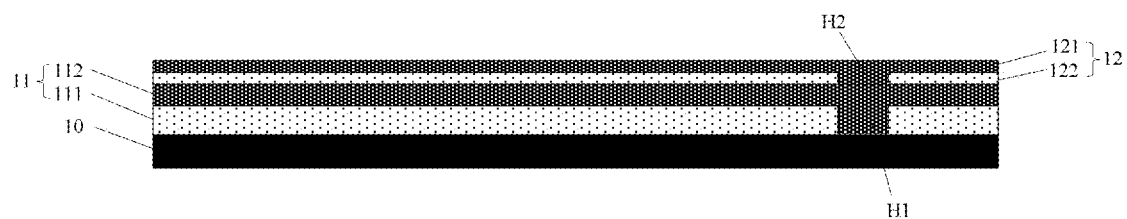
FIG. 4 is a schematic structural view of an electrode provided by some embodiments of the present disclosure.

Further alternatively, when the electrode includes two double-layer adjusting units, as shown in FIG. 4, the first double-layer adjusting unit 11 and the second double-layer adjusting unit 12 have different configurations. For example, a thickness of the second double-layer adjusting unit 12 may be smaller than that of the first double-layer adjusting unit 11. Similar to the embodiments shown in FIG. 2, the difference between the thickness of the first conductive layer 112 and the thickness of the first insulating layer 111 does not exceed the set threshold which is configured to control the thickness of the first insulating layer 111, so that the first electrode lead H1 electrically connected to the reflective layer 10 is formed in the via hole while the first conductive layer 112 is formed. Similarly, the difference between the thickness of the second conductive layer 122 and the thickness of the second insulating layer 121 does not exceed a set threshold which is configured to control the thickness of the second insulating layer 121, so that the second electrode lead H2 electrically connected to the first conductive layer 112 is formed in the via hole while the second conductive layer 122 is formed.

It can be understood that the above-mentioned electrode may be an anode or a cathode, which is specifically set according to an applied environment. The reflective layer 10 may be made of a light-shielding metal material, so that the reflective layer 10 may be used to reflect light on one hand and may be used to supply power to the electrode on the other hand. Typically, the reflective layer 10 is made of aluminum, and of course, it may also be made of other light-shielding metal materials. The insulating layer 111 is made of a transparent insulating material, such as $SiO_2$, $SiN_x$ or the like. The conductive layer 112 is made of a transparent conductive material, such as indium tin oxide, aluminum-doped zinc oxide, fluorine-doped tin oxide or the like.

In the above embodiments of the present disclosure, at least one double-layer adjusting unit is stacked on the reflective layer 10, and in each double-layer adjusting unit, the difference between the thickness of the conductive layer 112 and the thickness of the insulating layer 111 does not exceed a set threshold. The set threshold is configured to control the thickness of the insulating layer 111 so that the electrode lead H electrically connected to the reflective layer 10 is formed in the via hole while the conductive layer 112 is formed. Therefore, after the via hole is formed in the insulating layer 111, there is no need to first fill the via hole with a metal material forming the electrode lead H. It is only necessary to form a conductive material layer directly on a surface of the insulating layer 111 facing away from the reflective layer 10, so that the electrode Lead H made of a conductive material may be formed in the via hole while the conductive layer 112 is formed on the surface of the insulating layer 111 facing away from the reflective layer 10.

Further, if the via hole is filled with the metal material for forming the electrode lead, the electrode lead formed of the metal material will hinder the transmission of light so as to interfere with the reflective light from the reflective layer, causing an optical path of the light emitted to the reflective layer in the same light-emitting device to fluctuate. In contrast, in the electrode provided in the embodiments of the present disclosure, although the electrode lead H is still disposed in the via hole provided in the insulating layer 111, the electrode lead H and the conductive layer 112 are formed in one film forming process, so that the electrode lead H and the conductive layer 112 are made of the same material. Since the material of the conductive layer 112 is a light-transmitting material, an interference of the electrode lead H provided in the via hole provided in the insulating layer 111 on the light is relatively small.

In the above-mentioned embodiments provided by the present disclosure, when the difference between the thickness of the conductive layer and the thickness of the insulating layer does not exceed the set threshold in each double-layer adjusting unit, if the thickness of the conductive layer is relatively thin, the thickness of the insulating layer included in the double-layer adjusting unit including the conductive layer is relatively thin. In this case, the via hole may be formed in the insulating layer through a general etching method (such as wet etching), no special process is required to form the via hole in the insulation. The inventors of the present disclosure have discovered through research that when the difference between the thickness of the conductive layer and the thickness of the insulating layer described above does not exceed 250 Å in each double-layer adjusting unit, it is easier to adopt an etching process to form the via hole in the insulating layer.

In some exemplary embodiments, when forming the via hole in the above-mentioned insulating layer through a conventional etching process, the thickness of the above-mentioned insulating layer is less than 650 Å.

Optionally, when the electrode is applied to a light-emitting device having an optical microcavity effect, the thicknesses of the insulating layer and the conductive layer in the electrode need to meet a requirement of the optical path of the light. Based on this, the optical path of the light in the electrode is calculated by the following formula:

$$\Delta = (X_1 \times n_{11} + Y_1 \times n_{21}) + \ldots + (X_i \times n_{1i} + Y_i \times n_{2i}) + \ldots + (X_k \times n_{1k} + Y_k \times n_{2k}).$$

wherein, $\Delta$ is the optical path of the light in the electrode, $X_1$ is the thickness of the insulating layer 111 included in the first double-layer adjusting unit 11, $n_{11}$ is the refractive index of the insulating layer 111 included in the first double-layer adjusting unit 11, $Y_1$ is the thickness of the conductive layer 112 included in the first double-layer adjusting unit 11, $n_{21}$ is the refractive index of the conductive layer 112 included in the first double-layer adjusting unit 11, and so on, $X_i$ is the thickness of the insulating layer included in the $i^{th}$ double-layer adjusting unit, $n_{1i}$ is the refractive index of the insulating layer included in the $i^{th}$ double-layer adjusting unit, $Y_1$ is the thickness of the conductive layer included in the $i^{th}$ double-layer adjusting unit, and $n_{2i}$ is the refractive index of the conductive layer included in the $i^{th}$ double-layer adjusting unit, wherein, i is the serial number of the double-layer adjusting unit, i is an integer in the range of [1, k], k is the total number of double-layer adjusting units, and k is an integer not less than 1.

The thicknesses of the insulating layers included in the double-layer adjusting units may be the same or different. When the thicknesses of the insulating layers included in the double-layer adjusting units are the same, $X_1 = \ldots = X_i = \ldots = X_k$.

Further, the materials of the insulating layers included in the double-layer adjusting units may be the same or different. When the materials of the insulating layers included in the double-layer adjusting units are the same, $n_{11} = \ldots = n_{1i} = \ldots = n_{1k}$.

The thicknesses of the conductive layers included in the double-layer adjusting units may be the same or different. When the thicknesses of the conductive layers included in the double-layer adjusting units are the same, $Y_1 = \ldots = Y_i = \ldots = Y_k$.

Alternatively, the materials of the conductive layers included in the double-layer adjusting units may be the same or different. When the materials of the conductive layers included in the double-layer adjusting units are the same, $n_{21} = \ldots = n_{2i} = \ldots = n_{2k}$.

In order to explain the optical path of the light in the above electrodes in more detail, several specific examples are given below. The following examples are only for illustration and are not intended to be as a limitation.

In a conventional electrode, material of an insulating layer is $SiN_x$, and the refractive index of $SiN_x$ is 1.5, material of an electrode layer is indium tin oxide, and the refractive index of indium tin oxide is 1.8, and a thickness of the electrode layer is 50 Å. When a thickness of the insulating layer is 2000 Å, the optical path of the light in the conventional electrode is equal to 2000 Å×1.5+50 Å×1.8=3090 Å. When the thickness of the insulating layer is 1450 Å, the optical path of the light in the conventional electrode is equal to 1450 Å×1.5+50 Å×1.8=2265 Å. When the thickness of the insulating layer is 900 Å, the optical path of the light in the conventional electrode is equal to 900 Å×1.5+50 Å×1.8=1440 Å.

In contrast, the material of the insulating layer included in each of the double-layer adjusting units in the electrode provided in the embodiments of the present disclosure may be $SiN_x$, the refractive index of $SiN_x$ is 1.5, and the material of the conductive layer included in each of the double-layer adjusting units in the electrode provided in the embodiments of the present disclosure may be indium tin oxide, and the refractive index of indium tin oxide is 1.8. If the optical path of the light in the electrode provided by the embodiments of the present disclosure is also made to be 3090 Å, then when k=2, $X_1=X_2=500$ Å and $Y_1=Y_2=442$ Å. At this time, the light-emitting device includes a first double-layer adjusting unit 11 composed of a first insulating layer 111 and a first conductive layer 112, and a second double-layer adjusting unit 12 composed of a second insulating layer 121 and a second conductive layer 122. A first electrode lead H1 is provided in a first via hole, and a second electrode lead H2 is provided in a second via hole.

Alternatively, if the optical path of the light in the electrode provided by the embodiments of the present disclosure is made to reach 2265 Å, then when k=2, $X_1$=500 Å, $X_2$=200 Å, $Y_1$=442 Å, $Y_2$=233 Å. At this time, the light-emitting device includes a first double-layer adjusting unit 11 composed of a first insulating layer 111 and a first conductive layer 112, and a second double-layer adjusting unit 12 composed of a second insulating layer 121 and a second conductive layer 122. The first double-layer adjusting unit 11 and the second double-layer adjusting unit 12 have different configurations. A first electrode lead H1 is provided in a first via hole, and a second electrode lead H2 is provided in a second via hole.

Alternatively, if the optical path of the light in the electrode provided by the embodiments of the present disclosure is made to reach 1440 Å, then when k=1, $X_1$=500 Å and $Y_1$=383 Å. At this time, the light-emitting device includes a first double-layer adjusting unit 11 composed of a first insulating layer 111 and a first conductive layer 112. An electrode lead H is provided in a via hole provided in the first insulating layer 111.

Figure 5:
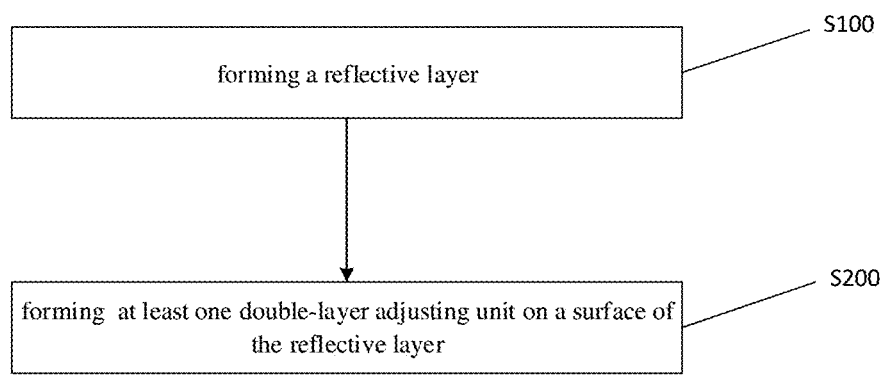
FIG. 5 is a flowchart of a method of manufacturing an electrode provided by some embodiments of the present disclosure.

Other embodiments of the present disclosure also provide a method of manufacturing the above electrode. As shown in FIG. 5, in step S100, a reflective layer is formed. Next, in step S200, at least one double-layer adjusting unit is stacked on a surface of the reflective layer. Each double-layer adjusting unit includes an insulating layer and a conductive layer which are sequentially arranged in a direction away from the reflective layer. A difference between a thickness of the conductive layer and a thickness of the insulating layer does not exceed a set threshold in each double-layer adjusting unit. A via hole is formed in the insulating layer of each double-layer adjusting unit, and an electrode lead H formed integrally with the conductive layer of the double-layer adjusting unit is formed in the via hole, so that the conductive layer is electrically connected to the reflective layer through the electrode lead H.

The beneficial effects of the method of manufacturing the electrode provided by the embodiments of the present disclosure are the same as the beneficial effects of the electrode provided by the foregoing embodiments, and details are not described herein.

In some specific embodiments, forming the at least one double-layer adjusting unit on the surface of the reflective layer 10 includes: forming an insulating layer on the surface of the reflective layer; then, forming a via hole in the insulating layer, for example, the via hole being formed in the insulating layer through an etching process; then, integrally forming a conductive material layer on the surface of the insulating layer away from the reflective layer and in the via hole, a portion of the conductive material layer on the surface of the insulating layer away from the reflective layer forms the conductive layer, and a portion of the conductive material layer filling the via hole forms the electrode lead. The conductive layer is electrically connected to the reflective layer through the electrode lead H.

Figure 6:
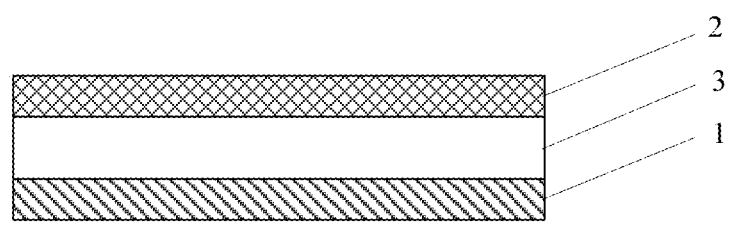
FIG. 6 is a schematic structural view of a light-emitting device provided by some embodiments of the present disclosure.

Some embodiments of the present disclosure further provide a light-emitting device, as shown in FIG. 6, including a first electrode 1. In particular, the first electrode 1 is the electrode provided by any one of the above embodiments.

The beneficial effects of the light-emitting device provided by the embodiments of the present disclosure are the same as the beneficial effects of the electrode provided by the foregoing embodiments, and details are not described herein.

The light-emitting device further includes a second electrode 2 and an electroluminescent functional layer 3 sandwiched between the first electrode 1 and the second electrode 2. The second electrode 2 is a transflective electrode, and light emitted from the electroluminescent functional layer 3 is emitted from a side of the second electrode 2. The reflective layer included in the first electrode 1, the transflective electrode 2 and a structure therebetween form an optical microcavity with relatively strong adjustment function. During operation, the electroluminescent functional layer 3 emits light under the action of the first electrode 1 and the second electrode 2. The light emitted by the electroluminescent functional layer 3 resonates in the optical microcavity, so that the brightness and color gamut of the light finally emitted from the transflective electrode are improved to a certain extent.

When the first electrode 1 is an anode, the second electrode 2 is a cathode. When the first electrode 1 is a cathode, the second electrode 2 is an anode.

Figure 7:
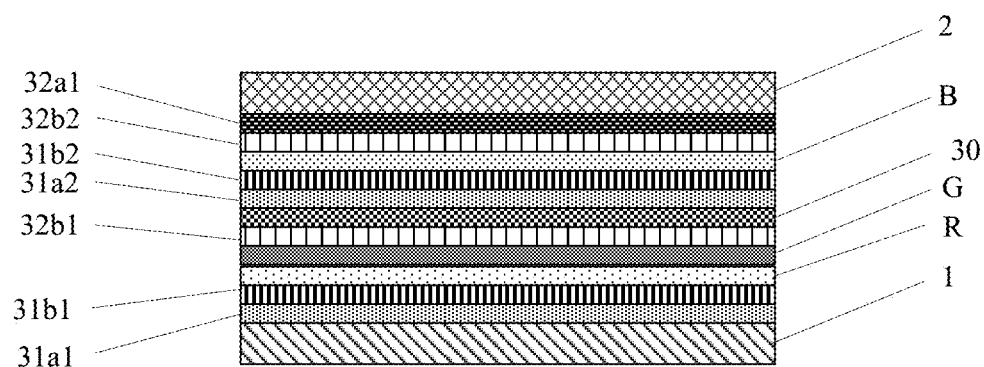
FIG. 7 is a schematic view of a specific structure of a light-emitting device provided by some embodiments of the present disclosure.

In some specific embodiments, as shown in FIG. 7, when the first electrode 1 is an anode and the second electrode 2 is a cathode, the electroluminescent functional layer 3 includes a first hole injection layer 31a1, a first hole transport layer 31b1, a red light-emitting layer R, a green light-emitting layer G, a first electron transport layer 32b1, a charge generation layer 30, a second hole injection layer 31a2, a second hole transport layer 31b2, a blue light-emitting layer B, a second electron transport layer 32b2, and a first electron injection layer 32a1 which are sequentially stacked in an light emission direction.

Alternatively, when the first electrode 1 is a cathode and the second electrode 2 is an anode, the electroluminescent functional layer 3 has a reversed arrangement, that is, includes the first electron injection layer 32a1, the second electrons transport layer 32b2, the blue light-emitting layer B, the second hole transport layer 31b2, the second hole injection layer 31a2, the charge generation layer 30, the first electron transport layer 32b1, the green light-emitting layer G, the red light-emitting layer R, the first hole transport layer 31b1 and the first hole injection layer 31a1 which are sequentially stacked in the light emission direction, such that a surface of the first electrode 1 facing the second electrode 2 is in contact with the first electron injection layer 32a1, and a surface of the second electrode 2 facing the first electrode 1 is in contact with the first hole injection layer 31a1.

In the light-emitting device shown in FIG. 6, a cavity length of the optical microcavity of the light-emitting device may be adjusted by adjusting at least one of the thickness of the insulating layer 111 of the double-layer adjusting unit 11 included in the first electrode 1 and the thickness of the conductive layer 112 of the double-layer adjusting unit 11 included in the first electrode 1. That is, the optical path of light in the optical microcavity may be adjusted. As the optical path of the light in the optical microcavity gradually increases, the spectrum of light emitted by the light-emitting device changes periodically. For example, as the optical path of the light in the optical microcavity gradually increases, the light-emitting device may sequentially emits blue light, green light, and red light, and as the optical path of the light in the optical microcavity continues to increase, the light emitting device may sequentially emit blue light, green light, and red light again. Each period of the change of spectrum of light corresponds to an optical path range, and each optical path range is referred as an optical path period.

Figure 8:
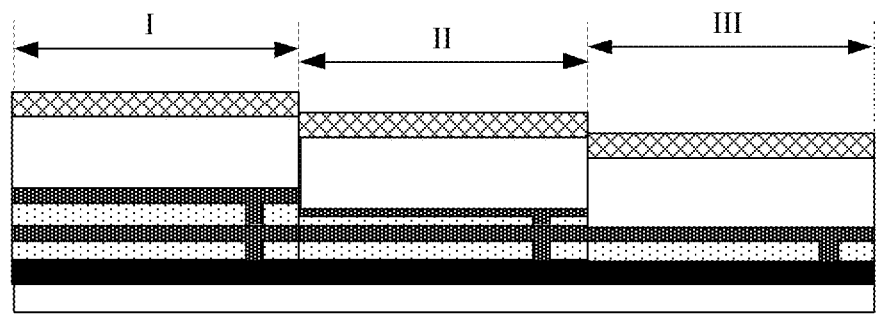
FIG. 8 is a schematic structural view of a display device provided by some embodiments of the present disclosure.

Some embodiments of the present disclosure further provide a display device. As shown in FIG. 8, the display device includes at least one foregoing light-emitting device.

The beneficial effects of the display device provided by the embodiments of the present disclosure are the same as the beneficial effects of the foregoing electrodes, and details are not described herein.

The display device provided in the foregoing embodiments may be any product or component having a display function, such as a mobile phone, a tablet computer, a television, a displayer, a notebook computer, a digital photo frame, or a navigator.

In exemplary embodiments, in the above display device, the electroluminescent functional layers 31 included in the light-emitting devices have the same thickness, the second electrodes 2 included in the light-emitting devices have the same thickness, and the thickness of the first electrode 1 included in each light-emitting device may be set according to the following rules.

In some exemplary embodiments, as shown in FIG. 8, the display device includes at least three light-emitting devices, and the at least three light-emitting devices includes a first color light-emitting device I, a second color light-emitting device II, and a third color light-emitting device III. The thickness of the first electrode 1 included in the first color light-emitting device I, the thickness of the first electrode 1 included in the second color light-emitting device II, and the thickness of the first electrode 1 included in the third color light-emitting device III are different from each other, so that light emitted by each of the first color light-emitting device I, the second color light-emitting device II and the third color light-emitting devices III has a relatively good monochromaticity.

When the first color light-emitting device I, the second color light-emitting device II, and the third color light-emitting device III are located in the same optical path period, the thickness of the first electrode 1 included in the first color light-emitting device I, the thickness of the first electrode 1 included in the second color light-emitting device II, and the thickness of the first electrode 1 included in the third color light-emitting device III are arranged from large to small according to an wavelength of the light emitted by the corresponding light-emitting device. If a light-emitting device of one color is located in a large optical path period, the thickness of the first electrode 1 included in the light-emitting device of the one color is greater than the thickness of the first electrode 1 included another light-emitting device of other color which is located in a small optical path period, regardless of the wavelength of the light emitted by the light-emitting device of the one color.

In other words, when setting the thickness of the first electrode included in each of the light-emitting devices of different colors included in the display device, the optical path period of each of the light-emitting devices is first determined, the thickness of the first electrode included in each of the light-emitting devices is set according to the order of the optical path period from large to small. Then the wavelength of the light emitted by each of the light-emitting devices which are located in the same optical path period is determined, the thickness of the first electrode included in each of the light-emitting devices which are located in the same optical path period is set according to the order of the wavelength from large to small.

For example, the first color light-emitting device I is a red light-emitting device, the second color light-emitting device II is a green light-emitting device, and the third color light-emitting device III is a blue light-emitting device. When the red light-emitting device, the green light-emitting device, and the blue light-emitting device are located in the same optical path period, as shown in FIG. 8, the thickness of the first electrode 1 included in the red light-emitting device, the thickness of the first electrode 1 included in the green light-emitting device, and the thickness of the first electrode 1 included in the blue light-emitting device are gradually decreased. Of course, if the red light-emitting device and the green light-emitting device are located in the first optical path period and the blue light-emitting device is located in the second optical path period, the thickness of the first electrode of the blue light-emitting device is the largest, the thickness of the first electrode of the red light-emitting device is the second, and the thickness of the first electrode of the green light-emitting device is the smallest.

For example, when the red light-emitting device, the green light-emitting device, and the blue light-emitting device included in the display device are located in the same optical path period, in each of the red light-emitting device, the green light-emitting device and the blue light-emitting device, the first electrode 1 is an anode, the second electrode 2 is a transflective electrode having a thickness of 120 Å, and the first electrode 1 is the electrode provided in any of the foregoing embodiments. In the first electrode 1, the material of each insulating layer is $SiN_x$, and the material of each conductive layer is indium tin oxide. Further, the electroluminescent functional layers respectively employed in the red light-emitting device, the green light-emitting device, and the blue light-emitting device have the same composition and the same thickness. Each of the electroluminescent functional layers includes a first hole injection layer 31a1 and a first hole transport layer 31b1, a red light-emitting layer R, a green light-emitting layer G, a first electron transport layer 32b1, a charge generation layer 30, a second hole injection layer 31a2, a second hole transport layer 31b2, a blue light-emitting layer B, a second electron transport layer 32b2 and a first electron injection layer 32a1 which are sequentially stacked.

Specifically, the first hole injection layer 31a1 has a thickness of 100 Å, the first hole transport layer 31b1 has a thickness of 200 Å, the red light-emitting layer R has a thickness of 250 Å, the green light-emitting layer G has a thickness of 100 Å, the electron transport layer 32b1 has a thickness of 200 Å, the charge generation layer 30 has a thickness of 100 Å, the second hole injection layer 31a2 has a thickness of 100 Å, the second hole transport layer 31b2 has a thickness of 200 Å, the blue light-emitting layer B has a thickness of 200 Å, the second electron transport layer 32b2 has a thickness of 200 Å, and the first electron injection layer 32a1 has a thickness of 100 Å.

Table 1 shows a thickness parameter of each of the red light-emitting device, the green light-emitting device, and the blue light-emitting device which are included in the display device provided by the embodiments of the present disclosure.

TABLE 1

| type of light-emitting device | a thickness parameter of each of a red pixel, a green pixel and a blue pixel | | | |
|---|---|---|---|---|
| | a thickness parameter of the first electrode | | | |
| | thickness of the first insulating layer/Å | thickness of the first conductive layer/Å | thickness of the second insulating layer/Å | thickness of the second conductive layer/Å |
| red light-emitting device | 500 | 442 | 500 | 442 |
| green light-emitting device | 500 | 442 | 200 | 233 |
| blue light-emitting device | 500 | 383 | / | / |

Figure 9:
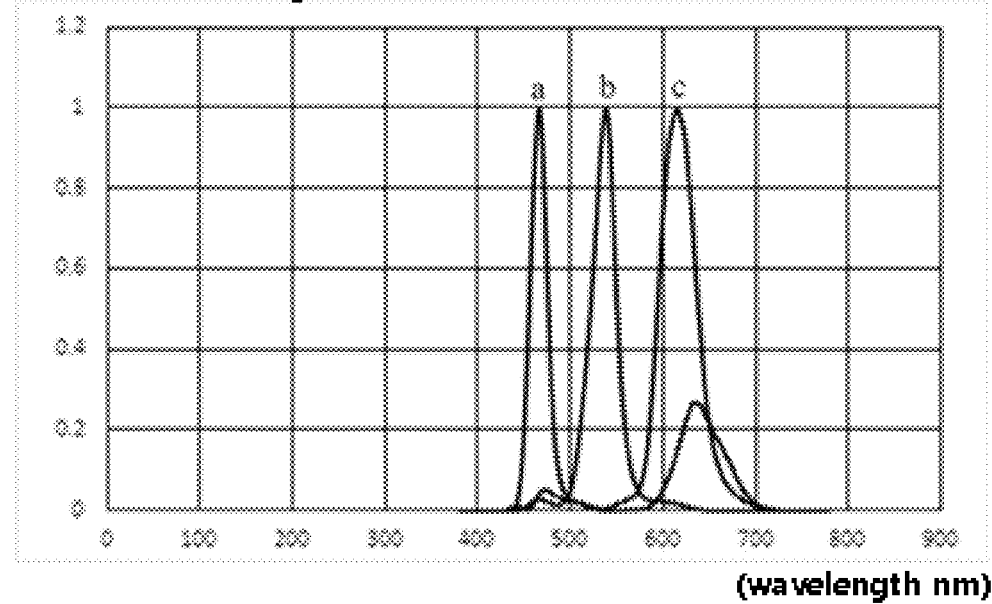
FIG. 9 is a light emission spectrum of RGB pixels in a display device provided by some embodiments of the present disclosure.

FIG. 9 illustrates a light emission curve of each light-emitting device in the display device shown in FIG. 8, wherein a is a light emission curve of the blue light-emitting device, b is a light emission curve of the green light-emitting device, and c is a light emission curve of the red light-emitting device. It can be seen from FIG. 9 that, by adjusting the thickness and the number of insulating layers of the first electrode included in each of the red light-emitting device, the green light-emitting device, and the blue light-emitting device, the adjustment performance of the optical microcavity formed in each of the red light-emitting device, the green light-emitting device and the blue light-emitting device is enhanced. Thus, the monochromaticity and brightness of the light emitted by each of the red light-emitting device, the green light-emitting device, and the blue light-emitting device is at a good level, thereby meeting the requirements of the color gamut and brightness of the image displayed by the display device. Moreover, when manufacturing the light-emitting device included in the display device provided by the embodiments of the present disclosure, the display effect of the display device manufactured by the RGB full-color side-by-side technology may be achieved without using the metal mask process applied in the RGB full-color side-by-side technology. In addition, when manufacturing the light-emitting device included in the display device provided by the present disclosure, the electroluminescent functional layer of each light-emitting device has the same thickness, and the second electrode of each light-emitting device has the same thickness, therefore, the electroluminescent functional layer of each light-emitting device may be manufactured by using the same mask (for example, by a evaporation manner), and the second electrode of each light-emitting device may be manufactured by using the same mask (for example, by a sputtering manner).

In the description of the foregoing embodiments, specific features, structures, materials, or characteristics may be combined in an appropriate manner in any one or more embodiments or examples.

The above are only specific implementations of the disclosure, but the scope of protection of the disclosure is not limited to this. Any changes or replacements that can be easily obtained by those skilled in the art within the technical scope disclosed in this disclosure shall be covered by the protection scope of this disclosure. Therefore, the protection scope of the present disclosure shall be subject to the protection scope of the claims.

What is claimed is:

1. A display electrode, comprising:
   a reflective layer; and
   two double-layer adjusting units stacked on the reflective layer, each double-layer adjusting unit comprising an insulating layer and a conductive layer sequentially arranged and directly contacted in a direction away from the reflective layer,
   wherein for at least one of the two double-layer adjusting units, a via hole is provided in the insulating layer, an electrode lead formed integrally with the conductive layer is provided in the via hole, and the conductive layer is electrically connected to the reflective layer through the electrode lead,
   wherein in each double-layer adjusting unit, a difference between a thickness of the conductive layer and a thickness of the insulating layer does not exceed a set threshold, and the set threshold is configured to control the thickness of the insulating layer,
   wherein the conductive layer farthest from the reflective layer locates on different levels in light-emitting regions of different types of light-emitting devices.

2. The display electrode according to claim 1, wherein the set threshold is 250 Å.

3. The display electrode according to claim 1, wherein for at least one of the two double-layer adjusting units, the thickness of the insulating layer is not greater than 650 Å.

4. The electrode according to claim 1, wherein an optical path of light in the electrode is calculated by the following formula:

$$\Delta=(X_1 \times n_{11}+Y_1 \times n_{21})+ \ldots +(X_i \times n_{1i}+Y_i \times n_{2i})+ \ldots +(X_k \times n_{1k}+Y_k \times n_{2k}),$$

wherein $\Delta$ is the optical path of the light in the electrode, $X_1$ is a thickness of the insulating layer included in a first double-layer adjusting unit of the at least one double-layer adjusting unit, $n_{11}$ is a refractive index of the insulating layer included in the first double-layer adjusting unit, $Y_1$ is a thickness of the conductive layer included in the first double-layer adjusting unit, $n_{21}$ is a refractive index of the conductive layer included in the first double-layer adjusting unit, $X_i$ is a thickness of the insulating layer included in an $i^{th}$ double-layer adjusting unit of the at least one double-layer adjusting unit, $n_{1i}$ is a refractive index of the insulating layer included in the $i^{th}$ double-layer adjusting unit, $Y_i$ is a thickness of the conductive layer included in the $i^{th}$ double-layer adjusting unit, $n_{2i}$ is a refractive index of the conductive layer included in the $i^{th}$ double-layer adjusting unit, i is an integer in the range of [1, k], k is the total number of the at least one double-layer adjusting unit, and k is an integer which is not less than 1.

5. The electrode according to claim 4, wherein $$X_1= \ldots =X_i= \ldots =X_k, \text{ and/or}$$

$$Y_1= \ldots =Y_i= \ldots =Y_k, \text{ and/or}$$

$$n_{11}= \ldots =n_{1i}= \ldots =n_{1k}, \text{ and/or}$$

$$n_{21}= \ldots =n_{2i}= \ldots =n_{2k}.$$

6. The electrode according to claim 4, wherein the insulating layer included in each double-layer adjusting unit is made of $SiN_x$ which has a refractive index of 1.5, and the conductive layer of each double-layer adjusting unit is made of indium tin oxide which has a refractive index of 1.8, and $$k=1, X_1=500 \text{ Å}, Y_1=383 \text{ Å; or}$$

$$k=2, X_1=500 \text{ Å}, X_2=200 \text{ Å}, Y_1=442 \text{ Å}, Y_2=233 \text{ Å; or}$$

$$k=2, X_1=X_2=500 \text{ Å}, Y_1=Y_2=442 \text{ Å}.$$

7. The display electrode according to claim 1, wherein the reflective layer comprises a shielding metal layer, and for at least one of the two double-layer adjusting units, the conductive layer is a transparent conductive material layer.

8. A method of manufacturing the electrode according to claim 1, comprising:
forming the reflective layer; and
forming the at least one double-layer adjusting unit on a surface of the reflective layer,
wherein each of the double-layer adjusting units comprises the insulating layer and the conductive layer sequentially arranged in the direction away from the reflective layer, the insulating layer is provided with the via hole, the electrode lead is provided in the via hole, the conductive layer is electrically connected to the reflective layer through the electrode lead, and the electrode lead is formed integrally with the conductive layer.

9. The method according to claim 8, wherein forming the at least one double-layer adjusting unit on the surface of the reflective layer comprises:
forming the insulating layer on the surface of the reflective layer;
forming the via hole in the insulating layer; and
forming a conductive material layer on a surface of the insulating layer away from the reflective layer,
wherein a portion of the conductive material layer on the surface of the insulating layer away from the reflective layer forms the conductive layer, and a portion of the conductive material layer filling the via hole forms the electrode lead.

10. The method according to claim 9, wherein forming the via hole in the insulating layer comprises:
forming the via hole in the insulating layer by an etching process.

11. A light-emitting device comprising a first electrode, the first electrode is the display electrode according to claim 1.

12. The light-emitting device according to claim 11, further comprising a second electrode and an electroluminescent functional layer between the first electrode and the second electrode, wherein the second electrode is a transflective electrode.

13. The light-emitting device according to claim 12, wherein the electroluminescent functional layer comprises a first hole injection layer, a first hole transport layer, a red light-emitting layer, a green light-emitting layer, a first electron transport layer, a charge generation layer, a second hole injection layer, a second hole transport layer, a blue light-emitting layer, a second electron transport layer, and a first electron injection layer which are stacked sequentially.

14. The light-emitting device according to claim 13, wherein the first electrode is an anode, the second electrode is a cathode, a surface of the first electrode facing the second electrode is in contact with the first hole injection layer, and a surface of the second electrode facing the first electrode is in contact with the first electron injection layer.

15. The light-emitting device according to claim 13, wherein the first electrode is a cathode, the second electrode is an anode, a surface of the first electrode facing the second electrode is in contact with the first electron injection layer, and a surface of the second electrode facing the first electrode is in contact with the first hole injection layer.

16. A display device comprising at least one light-emitting device according to claim 11.

17. The display device according to claim 16, comprising at least three light-emitting devices, the at least three light-emitting devices comprising a first color light-emitting device, a second color light-emitting device, and a third color light-emitting device,
wherein a thickness of the first electrode included in the first color light-emitting device, a thickness of the first electrode included in the second color light-emitting device and a thickness of the first electrode included in the third color light-emitting device are different from one another.

18. The display device according to claim 17, wherein,
the first color light-emitting device is a red light-emitting device, the second color light-emitting device is a green light-emitting device, and the third color light-emitting device is a blue light-emitting device, and
the red light-emitting device, the green light-emitting device, and the blue light-emitting device are disposed in the same optical path period, and the thickness of the first electrode included in the red light-emitting device, the thickness of the first electrode included in the green light-emitting device, and the thickness of the first electrode included in the blue light-emitting device are sequentially decreased.

19. The display electrode according to claim 1, wherein for the two double-layer adjusting units, a thickness of the insulating layer of a double-layer adjusting unit closer to the reflective layer is greater than a thickness of the insulating layer of a double-layer adjusting unit away from the reflective layer.

20. The display electrode according to claim 1, wherein for at least one of the two double-layer adjusting units, a material of the insulating layer comprises $SiO_x$ or $SiN_x$.

21. The display electrode according to claim 1, wherein a material of the reflective layer comprises Al.

* * * * *